(12) United States Patent
Paquette et al.

(10) Patent No.: US 9,167,714 B2
(45) Date of Patent: Oct. 20, 2015

(54) REVERSE WEDGELOCK DEVICE

(71) Applicant: Raytheon Company, Waltham, MA (US)

(72) Inventors: Jeffrey Paquette, Waltham, MA (US); Scott R. Cheyne, Waltham, MA (US); Dennis W. Mercier, Waltham, MA (US)

(73) Assignee: Raytheon Company, Waltham, MA (US)

( * ) Notice: Subject to any disclaimer, the term of this patent is extended or adjusted under 35 U.S.C. 154(b) by 268 days.

(21) Appl. No.: 13/867,931

(22) Filed: Apr. 22, 2013

(65) Prior Publication Data

US 2014/0314514 A1    Oct. 23, 2014

(51) Int. Cl.
*H05K 7/14* (2006.01)
*H05K 7/20* (2006.01)

(52) U.S. Cl.
CPC .......... *H05K 7/1404* (2013.01); *H05K 7/20545* (2013.01); *Y10T 29/49826* (2015.01)

(58) Field of Classification Search
CPC ...... F16B 2/14; H05K 7/1404; H05K 7/1407; H05K 7/1409; H05K 7/1442
USPC ........................................... 403/374.1–374.4
See application file for complete search history.

(56) References Cited

U.S. PATENT DOCUMENTS

| | | | |
|---|---|---|---|
| 3,971,186 A | 7/1976 | Havelka et al. | |
| 4,775,260 A | 10/1988 | Kecmer | |
| 4,823,951 A | 4/1989 | Colomina | |
| 4,909,752 A | 3/1990 | Hallum et al. | |
| 5,036,428 A | 7/1991 | Brownhill et al. | |
| 5,090,840 A | 2/1992 | Cosenza | |
| 5,253,963 A | 10/1993 | Ries | |
| 5,290,122 A | 3/1994 | Hulme | |
| 5,382,175 A | 1/1995 | Kunkel | |
| 5,404,274 A | 4/1995 | Bond et al. | |
| 5,407,297 A | 4/1995 | Hulme et al. | |
| 5,485,353 A | 1/1996 | Hayes et al. | |
| 5,607,273 A | 3/1997 | Kecmer | |
| 5,859,764 A | 1/1999 | Davis | |
| 7,031,167 B1 | 4/2006 | Zagoorey et al. | |
| 7,477,524 B2 | 1/2009 | Way | |
| 2003/0048618 A1 | 3/2003 | Adams et al. | |
| 2003/0146176 A1 | 8/2003 | Danello et al. | |
| 2010/0039770 A1 | 2/2010 | Danello et al. | |
| 2011/0176867 A1 | 7/2011 | Mosier et al. | |

FOREIGN PATENT DOCUMENTS

EP    0289686 A1    11/1988

OTHER PUBLICATIONS

PCT Application PCT/US2014/035032; filed Apr. 22, 2014; Raytheon Company; International Search Report mailed Oct. 23, 2014.

*Primary Examiner* — Daniel Wiley

(57) ABSTRACT

A reverse wedgelock device with multiple draw blocks disposed about a lead screw passing through the draw blocks, wherein the draw blocks may be compressed together and caused to displace about respective wedge surfaces upon tightening of the screw. Compression and displacement of the draw blocks can function to draw anchors associated with the draw blocks inward, which, when engaged with opposing objects, functions to draw the objects together.

20 Claims, 8 Drawing Sheets

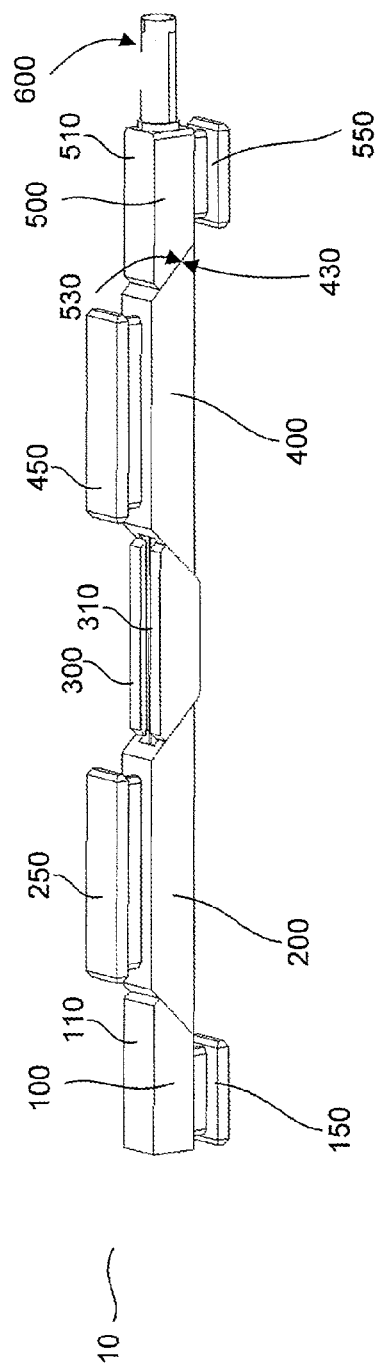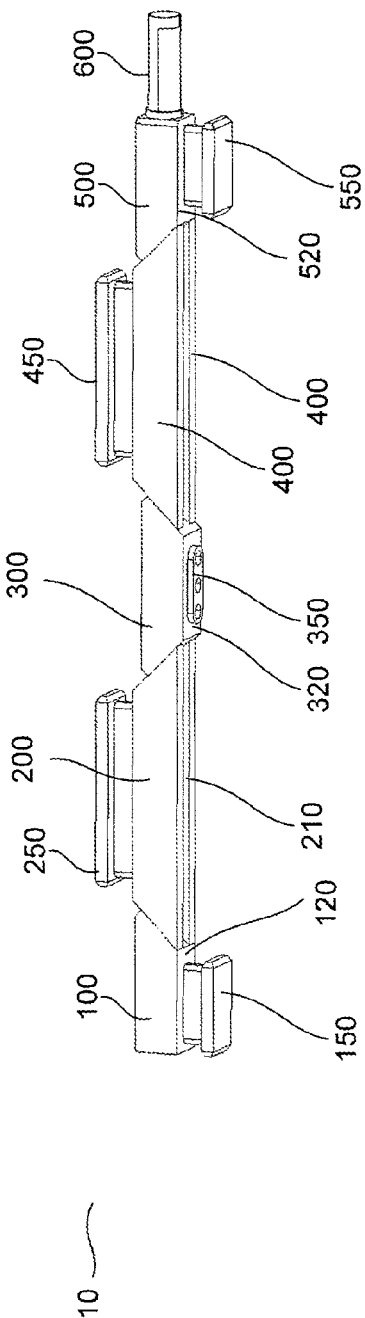

REVERSE WEDGELOCK DEVICE

BACKGROUND

Interfacing cold plates with electronics or electronics components for cooling purposes has been a longstanding problem. For example, in computing systems, it is not uncommon for large amount of heat to be generated during operation of the system. In low power systems, sufficient cooling is often achieved through edge cooling of an electronic component and an associated chassis. However, in many cases, as computing systems have become much more sophisticated and powerful, edge cooling has proven to be an inefficient and insufficient solution. As such, many computing systems now employ a base cooling solution in order to improve thermal performance. Base cooling solutions can result in a greater amount of surface area of the electronic component and chassis being in contact with the cooling plate, which functions as a heat dissipating device or heat sink, and can increase the amount and rate at which the heat can be removed or dissipated away from the electronic component. The larger the surface area in contact with the heat sink or cooling plate the higher the heat transfer efficiency becomes.

Wedge block chains, commonly known as wedgelocks, are devices used within a confined space, wherein the wedgelock provides a thermal interface and is configured to expand and apply a force upon the walls of the confined space to thereby spread the space apart. Wedgelocks may be used in electronic or electronics applications typically employing an edge cooled solution in order to provide an external pressure or force on an integral electronic component, forcing it against a cooling plate. Two opposing wedgelocks are commonly employed to press against an outer surface or frame and to pinch the electronic component and cooling plate between them in order to ensure good thermal contact between the electronic component and the cooling plate. Wedgelocks are particularly desirable for electronics because they can be configured to facilitate tightening along the entire length of the wedge block chain by means of a screw that can be accessed about an end, which allows easy access to what would otherwise be a constrictive working space. Also, by arranging wedgelocks in series one can optimize pressure distribution across an entire surface area to ensure contact between the electronic component and the cooling plate. Although wedgelocks may be employed in a large variety of applications they are particularly useful for providing thermal contact between electronic processing chips and chassis and cooling plates, particularly in applications where there may be multiple electronic components located in series within the confined space.

BRIEF DESCRIPTION OF THE DRAWINGS

The present invention will become more fully apparent from the following description and appended claims, taken in conjunction with the accompanying drawings. Understanding that these drawings merely depict exemplary embodiments of the present invention they are, therefore, not to be considered limiting of its scope. It will be readily appreciated that the components of the present invention, as generally described and illustrated in the figures herein, can be arranged and designed in a wide variety of different configurations. Nonetheless, the invention will be described and explained with additional specificity and detail through the use of the accompanying drawings in which:

FIG. 1 illustrates a top isometric view of an exemplary embodiment of a reverse wedgelock device in accordance with the present invention;

FIG. 2 illustrates a bottom isometric view of the reverse wedgelock device of FIG. 1;

DETAILED DESCRIPTION

Figure 1A:
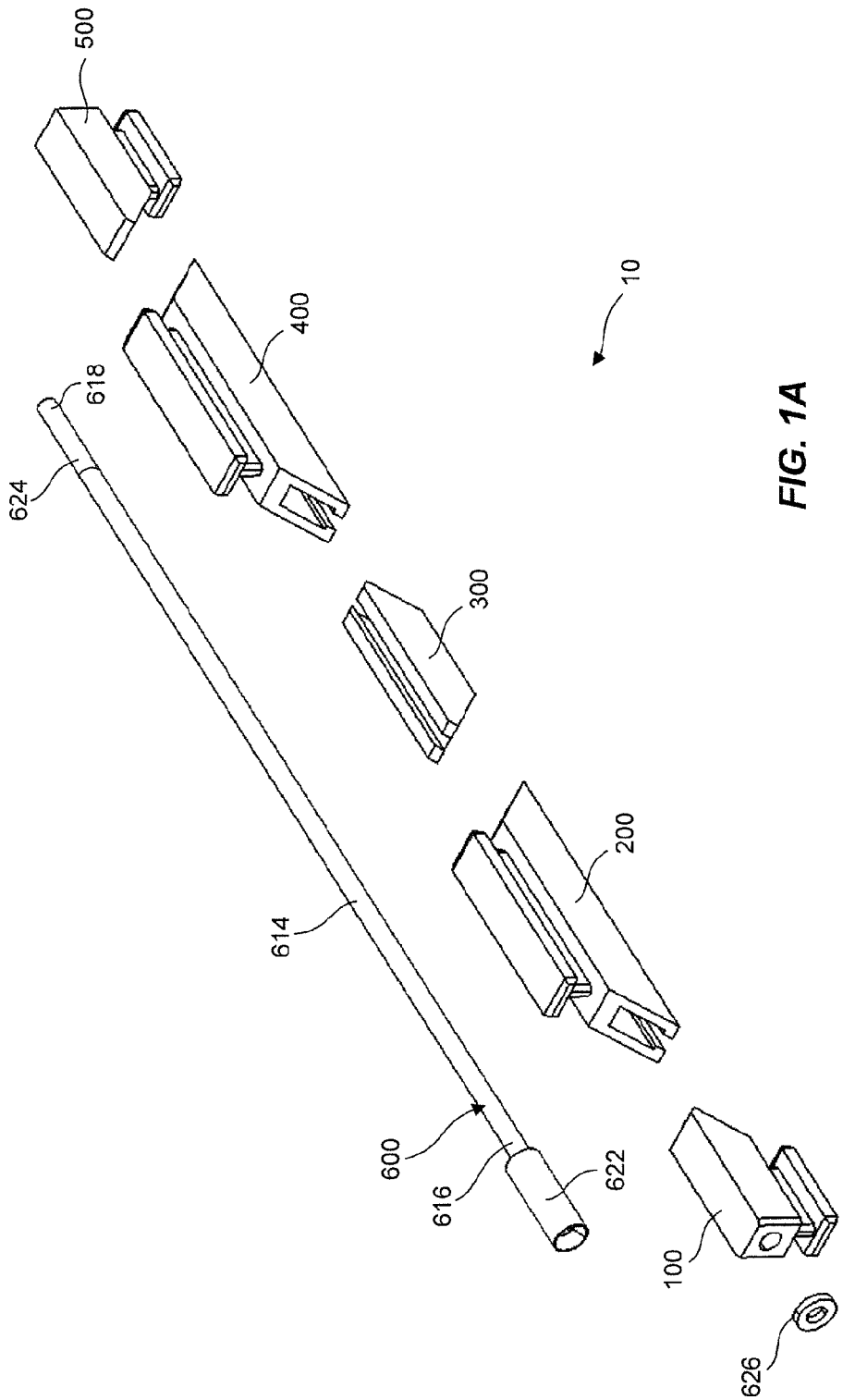
FIG. 1A illustrates an exploded view of the reverse wedgelock device of FIG. 1.

Avoiding the overheating of electronic components (e.g. computer processing chips, video cards, or motherboards in a server, etc.), remains a challenge. As power requirements and processing speeds increase the amount of energy required also increases, thus generating an increase in thermal energy or heat, which, if not dissipated away from the electronic components, can lead to failure of the electronic component(s). As a result, cooling of the electronic components to prevent their premature failure also remains a challenge.

A common practice in the electronics industry, particularly where multiple electronic components are arranged in series (e.g., within a large server), is to have numerous server boards arranged serially between large cold plates where each server board is attached at opposing edges to parallel cold plates. This type of electronic assembly and cooling method is often referred to as edge cooling. Edge cooling, tends to limit the size of the electronic components because heat generated by the electronic components in the center of the component must travel from the center to the edge of the electronic component. The further the heat must travel, the more difficult it is to remove the heat consistently. Inconsistency in heat removal often results in overheating and failure of the electronic component due to the lack of adequate dissipation of the heat generated, particularly at increased power levels.

A common solution to the overheating problems associated with edge cooling is to utilize a different configuration so as to have a larger contact area or thermal interface between the electronic component and its chassis and the cold plate. Instead of placing the cold plate at the edge of the electronic component and requiring the heat generated at the center of the electronic component to travel to the edge of the electronic component, the cold plate can instead be positioned parallel to the electronic component or its chassis and pressed against it in order to optimize the thermal interface between the cold plate and the electronic component or its chassis. This configuration or cooling solution is commonly referred to as base cooling. By utilizing this particular type of cooling solution, heat generated can be removed more efficiently as it is not required to travel to the edges in order to be removed from the electronics component and dissipated by the cold plate. This method has been shown to provide much more efficient cooling particularly at the center portions of electronic components.

In order to maximize the efficiency of a base cooling configuration the planar surface of the cold plate is intended to be in direct contact with the planar surface of the electronic component or its chassis. This is because direct contact provides a good thermal coupling or interface, as well as an optimal travel path for heat when transferring from the electronic component to the cold plate. However, if any gaps form between the cold plate and the electronic component or its chassis during operation the thermal efficiency drops because heat does not efficiently travel through empty space.

Many factors might cause a gap to form between the cold plate and the electronic component or its chassis. These factors may include warping due to heating, defects in manufacturing, or simply that the two surfaces are not adequately situated relative to one another. Some of these factors can present themselves with particularly high forces, and can require particularly high forces to counteract them and maintain a good thermal interface between the cold plate and the electronic component or its chassis. For example, warping during heating may require significant pressures to counteract.

It is to be understood that electronic components are often carried by some sort of chassis, and that any discussion of configurations or features in relation to cooling the chassis by the cold plate is similarly applicable to the electronic component itself. However, reference will be made hereinafter to only the chassis. It is noted that the discussions relating to the chassis and the electronic components are not meant to be limiting in any way. Indeed, those skilled in the art will recognize that electronic components and chasses can be configured differently, and that these may be present in any number or combination.

One method of improving or ensuring uniform contact between the planar surface(s) of the cold plate and the planar surface(s) of the electronic chassis is by applying an external force to press the electronic chassis to the cold plate. One particular technique that has been employed for this purpose utilizes what may be referred to as an expanding wedgelock. Expanding wedgelocks can be employed to provide the force needed or desired in order to press the electronic chassis to the cold plate. Although the range of motion can be limited, in confined spaces the forces exerted can be extremely high.

Traditional wedgelocks have been used between electronic components arranged in series in order to press the chassis of the electronic component to the coldplate. The wedgelocks function by pressing against an adjacent surface, usually an adjacent electronic component or cold plate. Two configurations are typically employed to implement traditional wedgelock devices. In one configuration, the traditional wedgelock can be spaced along the entire surface of the electronic component and chassis and expanded to provide a uniform pressing force. In a second configuration, the traditional wedgelock can be placed at an edge of the electronic chassis and expanded to press the electronic chassis to the cold plate. Some problems arise in both of these configurations. For example, when evenly spaced across the entire surface of the electronic component and chassis traditional wedgelocks may occupy large amounts of surface area that could otherwise be utilized (e.g., for wiring or other purposes). If placed at an edge, as discussed above, to free up the area on the electronic component extremely high forces may be needed to maintain a direct contact or thermal interface about the center, which may be insufficient to ensure such contact, or which may cause bending of the cold plate or the chassis. As such, designers often struggle between reducing the accessible or usable space on the surface of the electronic component or the chassis, or the possibility of inadequate or non-uniform application of forces which may cause gaps and overheating or bending of the component.

Exemplary embodiments of the invention seek to overcome the deficiencies of the prior art by providing an internal pulling force that functions to draw two components together. More specifically, the present invention provides a reverse wedgelock device that, upon manipulation of a lead screw, functions to pull/draw together two opposing components associated with the reverse wedgelock. As will be discussed in greater detail below, the reverse wedgelock, for example, when used within an electronics assembly or system having one or more electronic components and one or more cold plates, can be configured to provide many advantages over prior wedgelocks. In one example, the reverse wedgelock can be configured to apply uniform forces between a cold plate and an electronic component or chassis in contact with one another, without damaging or taking up valuable space on the surface of the electronic component. In addition, the reverse wedgelock device can be configured so as to not exert reaction forces on main structural components, which may damage them.

With reference to FIGS. 1-5, shown is a reverse wedgelock device and its various components in accordance with one exemplary embodiment of the present invention. In the exemplary embodiment shown, the reverse wedgelock 10 can comprise a plurality of draw blocks, for example, end draw blocks 100 and 500, intermediate draw blocks 200 and 400, and an anchor or stationary draw block 300, all arranged in series in a chain or block chain about a lead screw 600. The lead screw 600 can be configured to pass through an opening formed in each of the draw blocks and the stationary draw block 300 (e.g., see opening 160 formed in draw block 100, opening 260 formed in intermediate draw block 200, and opening 360 formed in stationary draw block 300). Although not shown, each of the remaining blocks in the reverse wedgelock 10 can comprise an opening into which the lead screw 600 may be inserted and through which the lead screw 600 may pass.

One or more draw blocks, such as intermediate draw blocks 200 and 400, and stationary draw block 300, can comprise an opening in the form of a slot that facilitates relative movement between the lead screw 600 and the draw block (e.g., see opening 260 of draw block 200, and opening 360 of draw block 300). Providing a slot type opening further functions to facilitate movement between adjacent draw blocks as the lead screw 600 is tightened to apply a compressive force to the draw block chain. Other draw blocks may be configured with openings that do not permit relative movement between the draw block and the lead screw (e.g., see opening 160 of end draw block 100), except for sliding in a bi-directional manner as the lead screw is manipulated and the reverse wedgelock 10 caused to constrict. Furthermore, a longitudinal axis of the reverse wedgelock 10 can be coaxial with a longitudinal axis of the lead screw 600, but this is not to be limiting in any way.

In one exemplary embodiment, the lead screw 600 can comprise a rod 614 having a first end 616 and a second distal end 618. The second distal end can comprise a segment 624 configured to be inserted into the end draw block 500. The lead screw 600 can further comprise a head portion 622 supported about the first end 616 of the rod 614. The head portion 622 can comprise a larger cross-sectional geometry than the cross-sectional geometry of the rod (e.g., a larger diameter) to prevent the lead screw 600 from completely passing through the various draw blocks 100, 200, 300, 400 and 500. The lead screw 600 can further comprise a washer or other similar device 626 operable with the head portion 622 and the rod 614. The lead screw can be configured to be inserted into each of the draw blocks 100, 200, 300, 400 and 500 within the draw block chain to form the assembled reverse wedgelock device 10. The distal end 618 of the rod may be secured within the end draw block 500, such as via an insert supported within the end draw block 500, or corresponding threading disposed on the lead screw and within the end draw block 500. At the opposite first end 616, the head portion 622 can be configured to seat against the outer surface of the first end draw block 100 upon inserting the rod through the various blocks within the block chain. Once in place, the lead screw can be manipulated to cause the various blocks in the reverse wedgelock device 10 to displace and the reverse wedgelock device 10 to constrict as described in greater detail below. The head portion 622 may comprise a tool interface (e.g., a hex-type interface) configured to receive a tool to facilitate manipulation of the lead screw 600. Other configurations of lead screws may be possible and are contemplated herein. As such, the embodiment described above and shown in the drawings should not be construed as limiting in any way.

Generally speaking, tightening the lead screw 600 can function to apply a compressive force to compress or constrict the block chain and cause one or more of the draw blocks to slide relative to one or more adjacent draw blocks. Indeed, tightening the lead screw 600 can cause adjacent draw blocks to move radially outward in opposing directions of travel. Further, each draw block can comprise a leading side facing the direction of travel and an opposing trailing side facing in a direction away from the direction of travel.

This compression and radial translation can be achieved by configuring the draw blocks to comprise a wedge surface. A wedge surface can be considered a planar surface that is oriented on an incline relative to the leading side or the trailing side of the draw block, or relative to the longitudinal axis of the lead screw. A wedge surface of a draw block can be configured to abut an opposing wedge surface of an adjacent draw block. As situated, upon tightening the lead screw the draw blocks are then caused to compress and to translate along their respective wedge surfaces.

In the exemplary embodiment shown, end draw block 100 can be configured to comprise a wedge surface 130B, which can be configured to abut wedge surface 230A of draw block 200 when draw block 100 and draw block 200 are situated adjacent one another about the lead screw 600. Draw block 200 can comprise an additional wedge surface 230B that can be configured to abut wedge surface 330A of stationary draw block 300 when draw block 200 and stationary draw block 300 are situated adjacent one another about the lead screw 600. Anchor or stationary draw block 300 can comprise an additional wedge surface 330B that can be configured to abut a wedge surface of draw block 400 when draw block 300 and draw block 400 are situated adjacent one another about lead screw 600. Draw block 400 can comprise an additional wedge surface 430B that can abut a wedge surface 530A of end draw block 500 when draw block 400 and draw block 500 are situated adjacent one another about the lead screw 600. As one skilled in the art will appreciate, the reverse wedgelock device 10 can comprise any number of draw blocks, and those illustrated herein should not be considered to be limiting in any way. Moreover, it will be appreciated that the wedge surfaces of adjacent draw blocks can be formed on a similar incline or angle so as to provide a mating surface between the draw blocks that facilitates translation of the blocks relative to one another and the lead screw 600.

The one or more draw blocks within the reverse wedgelock device 10 can further comprise a leading side and an opposing trailing side. In one exemplary embodiment, the leading side can be configured to comprise a greater length than the trailing side. Upon manipulation and constriction of the lead screw, the various draw blocks can be configured to move in a radial direction outward from the lead screw, and particularly a longitudinal axis of the lead screw. For example, in the embodiment shown, end block 100 can comprise a leading side 110 and an opposing trailing side 120. Intermediate draw block 200 can comprise a leading side 210 and a trailing side 220. Stationary draw block 300 can comprise a side 310 and an opposing side 320, but these are not described as leading and trailing sides in this particular embodiment as the stationary draw block is not intended to move or float, although these surfaces do provide draw functionality and are intended to facilitate draw or relative movement with respect to adjacent blocks. Intermediate block 400 can comprise a leading side 410 and an opposing side 420. End block 500 can comprise a leading side 510 and a trailing side 520. As the lead screw 600 is constricted, one or more of the blocks 100, 200, 300, 400 and 500 can be configured to move relative to their respective adjacent blocks in an outward direction away from the lead screw 600. In this manner, the distance between the leading sides of the various blocks and the longitudinal axis of the lead screw will be increased, while on the other hand, the distance between the trailing sides of the various blocks and the longitudinal axis of the lead screw will be reduced, thus shortening the overall length of the reverse wedgelock device 10. Stated another way, upon constriction of the lead screw, the distance between a trailing side of one block and an opposite facing trailing side of an adjacent block will be reduced, while the distance between opposing facing leading sides will be increased.

In order to facilitate the ability of the reverse wedgelock 10 to pull the object(s) coupled thereto together rather than to push them apart, one or more of the various blocks within the reverse wedgelock device 10 can further comprise an anchor configured to interface with the object(s), such as two opposing objects intended to be operably coupled to the reverse wedgelock device 10. In the embodiment shown, end blocks 100, 500 and intermediate blocks 200, 400 can each comprise an anchor supported about and/or extending from their trailing sides, namely trailing sides, 120, 520 and 220, 420, respectively. Indeed, as shown, end block 100 can comprise an anchor 150 extending from its trailing side 120. Intermediate block 200 can comprise an anchor 250 extending from its trailing side 220, which anchor 250 extends in a direction opposite from that of anchor 150. Intermediate block 400 can comprise an anchor 450 extending from its trailing side 420. And, end block 500 can comprise an anchor 550 extending from its trailing side 520, which anchor 550 extends in a direction opposite from that of anchor 450.

The anchors each can be designed and configured to be coupled or secured to or otherwise securely interface with opposing objects, whereupon tightening of the lead screw 600 and compression of the block chain causes one or more of the blocks to move relative to one another, and ultimately to draw inward the anchors. As the anchors are drawn inward, and as the opposing objects are each secured to the reverse wedgelock device, the opposing objects are caused to be drawn together, or at least caused to be subject to a load or force applied upon the opposing objects having a tendency to draw the objects together.

The actual configuration of the anchors will be discussed in more detail below. While the block chain may have any number of blocks, it is advantageous to have at least one draw block for drawing in a first direction and an additional draw block for drawing in a second opposing direction, therefore facilitating an opposing pulling or drawing force on opposing objects operable with the reverse wedgelock device.

Figure 3:
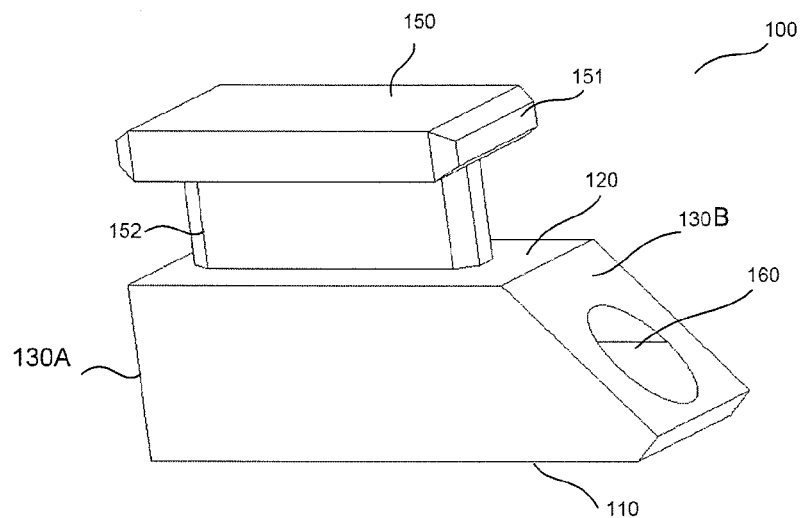
FIG. 3 illustrates a perspective view of an end draw block of the reverse wedgelock device of FIG. 1.

FIG. 3 illustrates an isometric view of an exemplary end draw block 100. End draw block 100 comprises an anchor 150 secured to or otherwise extending from the trailing side 120, which faces in a direction opposite that of the leading side 110. The anchor can be configured as a T-shaped anchor with a flange section 151 and a web section 152. The web section and the flange section can together form a T-shaped anchor, which can slidably interface with and couple or secure to a first object. The anchor 150 can further comprise a transition feature (e.g., chamfers) formed along the edges of the flange section 151 and the web section 152. The end draw block 100 can further comprise a flat end surface 130A, and a wedge surface 130B, which, as discussed above, can be configured to abut against an opposing wedge surface of an adjacent block, which may be for example wedge surface 230A of intermediate draw block 200 as depicted in FIGS. 1, 1A, 2 and 5, and discussed below.

A lead screw slot 160 can be formed through a central portion of the end draw block 100. The lead screw slot 160 can be configured to extend through the end draw block 100 from the flat end surface 130A to the wedge surface 130B. The lead screw slot 160 can be configured to receive at least a portion of the lead screw (not shown, but see FIGS. 1, 1A and 2) therein, and can function to allow the lead screw to pass through the end draw block 100, thus partially forming the reverse wedgelock device 10, as shown in FIGS. 1, 1A and 2. The lead screw slot 160 can comprise a cross-sectional geometry similar to that of the lead screw. In the embodiment shown, the lead screw slot 160 is shown as comprising a circular cross-sectional configuration, which provides a good mating interface between a similarly configured lead screw and the end draw block 100. It should be appreciated that the lead screw slot 160 may comprise any number of cross-sectional geometries that facilitate displacement of the end draw block 100 with respect to the lead screw. Furthermore, in this particular embodiment, the lead screw slot 160 is configured with a diameter substantially similar to the diameter of the lead screw to be inserted therein. In this case, movement of the end draw block 100 relative to the lead screw is limited to translational movement (i.e., sliding) along the lead screw. In other words, the lead screw slot 160 can be configured so as to constrain movement of the end draw block 100 in a radial direction relative to the lead screw (as viewed from an end of the lead screw). As so configured, the end draw block 100 functions to drive an adjacent intermediate block (e.g., block 200 of FIGS. 1, 1A, and 2) along its wedge surface 130B.

End draw block 100 can further comprise a surface (e.g., see surface 130A) configured to interface with a portion of the lead screw, or with one of its component parts, in order to provide a surface upon which the lead screw can apply a force that facilitates its constriction. With at least a portion of the lead screw extending through the lead screw slot 160, an additional portion may be caused to engage the surface 130A of the end draw block 100 in order to prevent the lead screw from releasing from the end draw block 100 during tightening of the lead screw and compression of the reverse wedgelock block chain.

The T-shaped anchor 150 can be configured to fit within a corresponding T-shaped channel formed within an anchoring surface of an object intended to be operable with the reverse wedgelock device. These surfaces and channels will be discussed in greater detail below in relation to FIG. 7. However, T-shaped anchor 150 can further function to provide the anchor 150, and therefore the end draw block 100, with the ability to slide within the corresponding T-shaped channel of the object as the reverse wedgelock device is constricted. Stated differently, one or more of the draw blocks can be configured to slidably engage an object, such as an electronic chassis or cold plate of an electronics system.

As can be seen, and as will be discussed below, each of the anchors present within the reverse wedgelock device can be configured to facilitate sliding of their respective blocks within corresponding channels of an object, similar to the end draw block 100 discussed above. This ability of one or more of the blocks of the reverse wedgelock device to slide relative to the object to which they are coupled facilitates compressing (i.e., shortening in length) of the reverse wedgelock device upon tightening of the lead screw. This feature further functions to facilitate the displacement of adjacent draw blocks within the block chain of the reverse wedgelock device relative to one another (i.e., sliding of adjacent blocks relative to one another along their abutting wedge surfaces) to facilitate or cause the drawing functionality intended to be provided by the reverse wedgelock device.

It is noted herein, that end draw block 500 may be similarly configured to end draw block 100 and any discussion regarding features and configurations of end draw block 100 may be similarly applied, in any combination, to end draw block 500.

Figure 4:
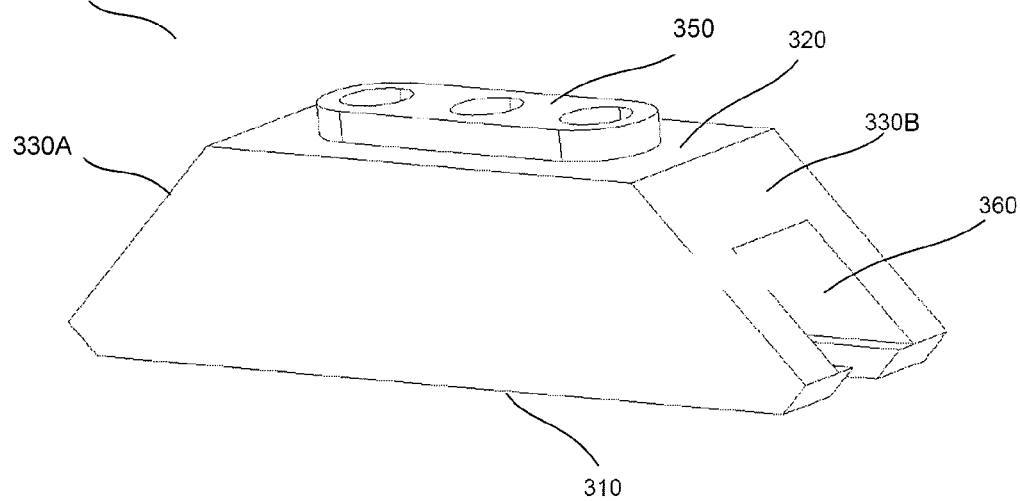
FIG. 4 illustrates a perspective view of a stationary draw block of the reverse wedgelock device of FIG. 1.

FIG. 4 illustrates an isometric view of the exemplary stationary draw block 300. Stationary draw block 300 is shown as comprising a side 310, a side 320, as well as wedge surfaces 330A and 330B. Similar to end draw block 100, as discussed in relation to FIG. 3, the wedge surfaces 330A and 330B of stationary draw block 300 are configured to engage and abut the wedge surfaces of an adjacent draw block, wherein the stationary draw block 300 and the adjacent block(s) may slide about the wedge surfaces relative to one another upon constriction of the lead screw (not shown). Stationary draw block 300 may further comprise an anchor 350 affixed to or otherwise supported about and extending from the side 320. The anchor 350 of draw block 300 can differ from the T-Shaped anchor as discussed above with relation to end draw block 100 in that the anchor 350 can be permanently affixed to an object (e.g., chassis or cold plate of an electronic system) operable with the reverse wedgelock device, thus fixing the stationary draw block 300 in place relative to the object. The anchor 350 can function to prevent axial float of the stationary draw block 300. The anchor 350 can be secured to the object using any known means, such as via fasteners operable with one or more features formed within the anchor 350 (e.g., holes or apertures).

The term "float" or "axial float" can used to describe movement of one or more draw blocks along the lead screw in an axial direction (i.e., in a direction substantially parallel to the longitudinal axis of the lead screw) and relative to an object (e.g., cold plate or chassis of an electronic component) to which the reverse wedgelock device is secured.

This prevention of axial float of the stationary draw block 300 prevents creeping of the reverse wedgelock device upon constriction or tightening of the lead screw. For example, in the event one of the floating draw blocks within the reverse wedgelock device were to bind against the object with which it is engaged, upon further tightening of the lead screw and compression of the draw block chain the entire reverse wedgelock device could have a tendency to creep (i.e., the other floating draw blocks would have a tendency to slide or shift in a direction towards the binding point). Creeping of the entire reverse wedgelock may result in a gap in contact between the opposing objects (e.g., the cold plate and electronic chassis), such as at an edge location, as the reverse wedgelock is out of position and therefore ineffective to pull them together sufficiently to maintain complete contact. By anchoring or fixing at least one of the blocks within the block chain, such as the stationary draw block 300, creeping of the reverse wedgelock device is prevented, even as all of the other draw blocks within the block chain are permitted to move or float relative to the object(s) to which the reverse wedgelock device is secured. Indeed, any draw blocks not fixed to the object(s) can be configured to float. In the event at least one block is fixed to the object, floating of the remaining, unfixed blocks will be toward the fixed block. For example, with reference to the reverse wedgelock device 10 of FIGS. 1, 1A and 2, stationary draw block 300 may be fixed to an object (e.g., chassis or cold plate of an electronic device), with draw blocks 100, 200, 400 and 500 being unfixed and configured to move and float (although they can be slidably engaged with an object via the anchors as discussed herein). Upon tightening the lead screw 600, each of these blocks will have a tendency to move and float towards the fixed stationary draw block 300. As such, it can be said that the floating of the blocks within the reverse wedgelock can be controlled to ensure proper application of forces along the entire contact area between opposing objects (e.g., the cold plate and the electronic chassis).

However, those skilled in the art will appreciate that in other exemplary embodiments, where creep may not be a factor, or perhaps less of a factor, the reverse wedgelock device may comprise draw blocks that are all configured to float, or in other words, the reverse wedgelock device may not comprise any blocks that are intended to be fixed to an object. For example, a reverse wedgelock device formed in accordance with another exemplary embodiment intended for a particular application and/or implementation may not warrant the need for a stationary draw block. In such a case, a draw block configured to float may be utilized rather than a stationary block, with the floating draw block comprising an anchor similar to the anchors discussed herein.

The stationary draw block 300 may further comprise a lead screw slot 360 configured to receive the lead screw (not shown), and through which the lead screw may pass. Lead screw slot 360 can be configured to extend from wedge surface 330A to wedge surface 330B of the stationary draw block 300, thus passing through the stationary draw block 300. In this particular embodiment, lead screw slot 360 is configured differently from the lead screw slot 160 of the end block 100 of FIG. 3 in that the lead screw slot 360 is configured as a slot having a rectangular cross-sectional geometry that facilitates movement or displacement of the lead screw within the slot along different axes. For example, the lead screw can displace along an axis parallel to the longitudinal axis of the lead screw in a sliding manner relative to the stationary draw block 300. Likewise, due to the rectangular cross-sectional configuration of the lead screw slot 360, the lead screw can move in a direction along an axis transverse to the longitudinal axis of the lead screw (i.e., the stationary draw block can shift within the lead screw slot toward or away from the top or bottom of the lead screw slot 360). As the lead screw is tightened, and as the draw blocks displace relative to one another along the wedge surfaces effectively shortening the reverse wedgelock device, the lead screw and the draw blocks can be permitted to move relative to one another to prevent binding within the reverse wedgelock device.

The lead screw slot 360 can further comprise one or more extension portions that extend towards one another from opposing sides of the lead screw slot 360, or a closed bottom, to prevent the lead screw from coming out of the lead screw slot 360, or rather to retain the stationary draw block 300 on the lead screw. The rectangular cross-sectional geometry of the lead screw slot 360 is not intended to be limiting in any way as those skilled in the art will recognize other configurations are possible to achieve similar functionality. but may be any shape configured so as to allow radial translation of stationary draw block 300 with respect to the lead screw (not shown).

Figure 5:
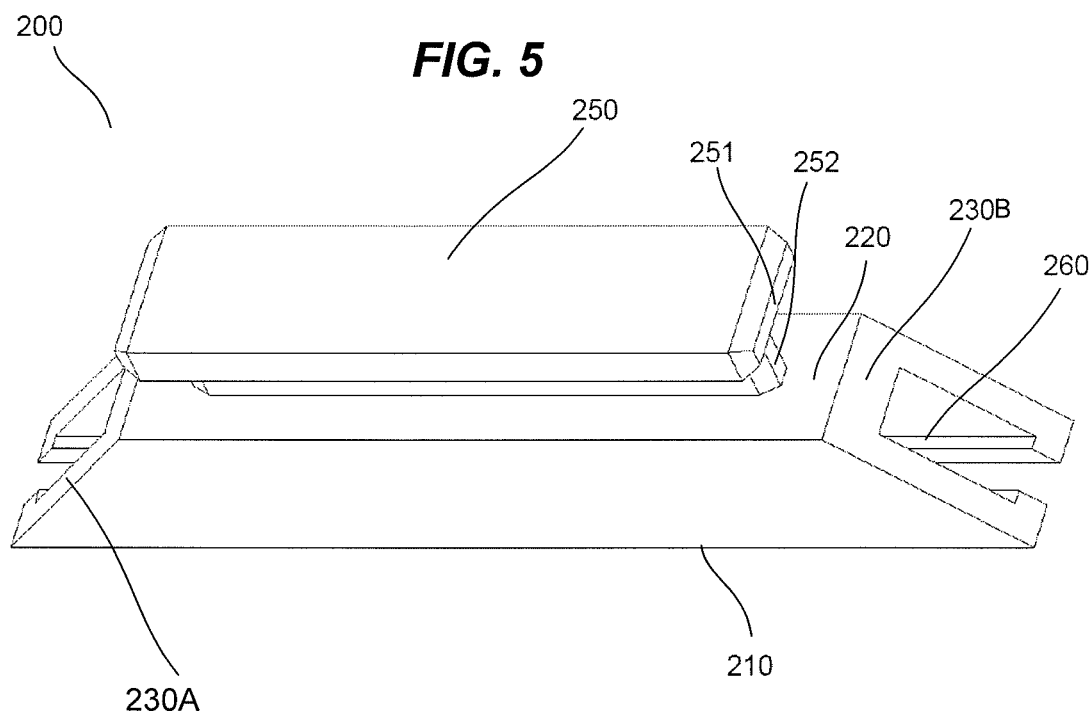
FIG. 5 illustrates a perspective view of an intermediate draw block of the reverse wedgelock device of FIG. 1.

With reference to FIG. 5, shown is an isometric view of an intermediate draw block 200. Intermediate draw block 200 may comprise opposing wedge surfaces 230A and 230B, as well as a leading side 210 and a trailing side 220. Draw block 200 may also comprise an anchor 250 extending from the trailing side 220, which anchor 250 is configured and functions similar to the various other anchors described herein, and shown in the drawings. The anchor 250 may comprise a flange section 251 and web section 252 affixed to or otherwise supported about the trailing side 220. Similar to the various other anchors discussed herein and shown in the drawings, anchor 250 is designed and configured to slidably engage and interface with an object. For example, the anchor 250 may be inserted into a corresponding channel (not shown) formed in the object to which the reverse wedgelock device is intended to be operable with, which corresponding channel will be discussed below in relation to FIG. 7.

Intermediate block 200 may further comprise a lead screw slot 260 formed therein, and that functions similar to the lead screw slot 360 of the stationary draw block 300 of FIG. 4.

Any and all configurations and features discussed in relation to intermediate draw block 200 may be similarly applied in any combination to intermediate draw block 400.

Figure 7:
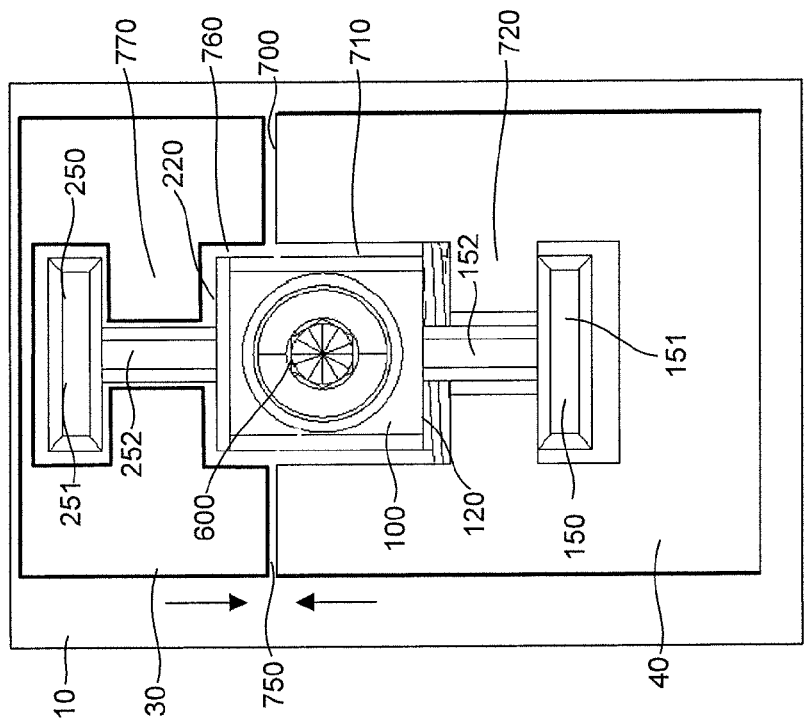
FIG. 7 Illustrates an end view of the reverse wedgelock device of FIG. 1 as situated in opposing channels formed in anchoring surfaces of two opposite facing objects of an assembly, each of which are operable with the reverse wedgelock device.
Figure 6:
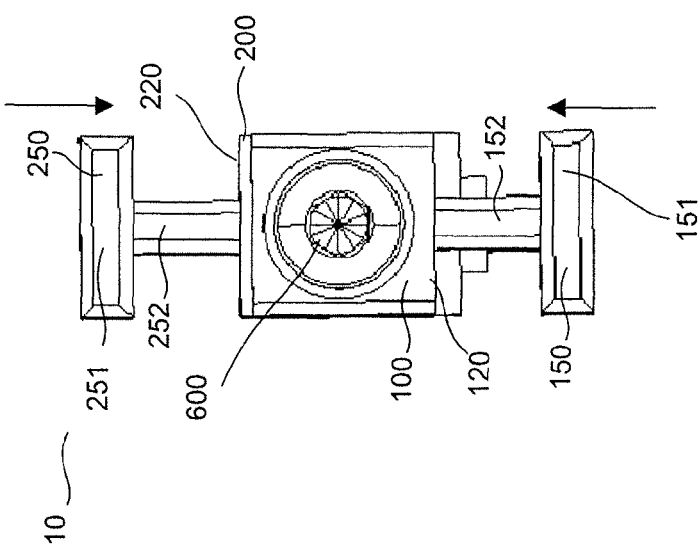
FIG. 6 illustrates an end view of the reverse wedgelock device of FIG. 1.

With reference to FIGS. 6 and 7, shown is an end view of the reverse wedgelock device 10 of FIGS. 1, 1A and 2. As shown, the T-shaped anchor 150, with its flange portion 151 and web portion 152, extends from the trailing side 120 of the draw block 100. Likewise, T-shaped anchor 250, with its flange portion 251 and web portion 252, extends from the trailing side 220 of intermediate draw block 200, but in an opposing radial direction from the anchor 150, and as measured from the centerline of the lead screw 600. Although not shown, it is to be understood that the additional anchors of the additional blocks within the block chain of the reverse wedgelock device 10 of FIGS. 1, 1A and 2 are similarly configured to extend in opposing directions. With adjacent draw blocks configured to abut one another along opposing wedge surfaces, and with adjacent draw blocks comprising anchors extending radially outward from the lead screw 60 in opposing directions, the reverse wedgelock device 10 is configured to engage and interface with two opposing objects.

FIG. 7 shows the reverse wedgelock device 10 of FIG. 1 as engaged with and interfacing with a first object in the form of an electronic chassis 30 having a channel 760 formed into an anchoring surface 750 thereof, and a second object in the form of a cold plate 40 having a channel 710 formed into an anchoring surface 700 thereof. Channel 760 comprises a size and shape that corresponds to the size and shape of the anchor 250 of the intermediate draw block 200, such that the anchor 250 can be received within the channel 760 to interface with and engage the electronic chassis 30. Likewise, channel 710 comprises a size and shape that corresponds to the size and shape of the anchors 150 of the end block 100, such that the anchor 150 can be received within the channel 710 to interface with and engage the cold plate 40. As the lead screw 600 is tightened, the draw blocks 150 and 250 (as well as other draw blocks within the block chain that are not specifically shown here, but that are shown in FIGS. 1, 1A and 2) are caused to move in a direction to draw the anchors 150 and 250 inward, which effectively functions to apply an increased tensioning force on the chassis and the cold plate, and which effectively functions to draw the chassis and the cold plate together.

Those skilled in the art will appreciate that even though a T-shaped anchor (and corresponding channel in the object) is shown in the drawings and discussed herein, this is not intended to be limiting in any way. Indeed, it is contemplated that other anchor configurations are available that are capable of providing the intended functionality of the anchor as discussed herein. More specifically, any anchor configuration (and corresponding channel configuration within the object) that facilitates a slideable interface and engagement with an object, and that provides an anchoring function as intended herein is contemplated and is to be considered within the bounds of the present invention. For example rather than a T-shaped flange, a bulbous, cylindrical, or any other configuration or shape could be used.

Figure 8:
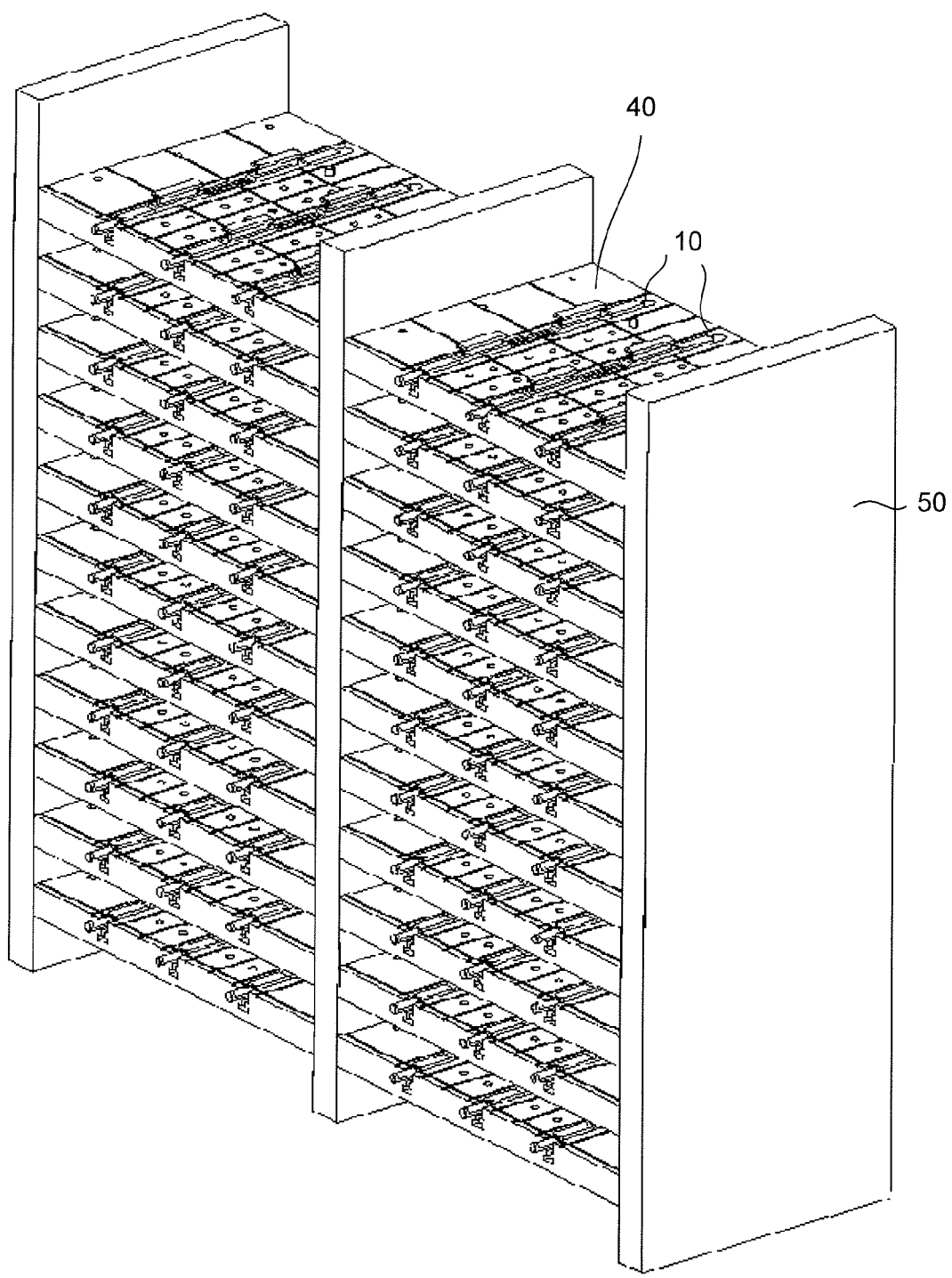
FIG. 8 illustrates a perspective view of an electronic assembly employing a plurality of reverse wedgelock devices formed in accordance with the embodiment of FIG. 1, wherein the plurality of reverse wedgelock devices are operable with a plurality of cooling plates arranged in series.
Figure 9:
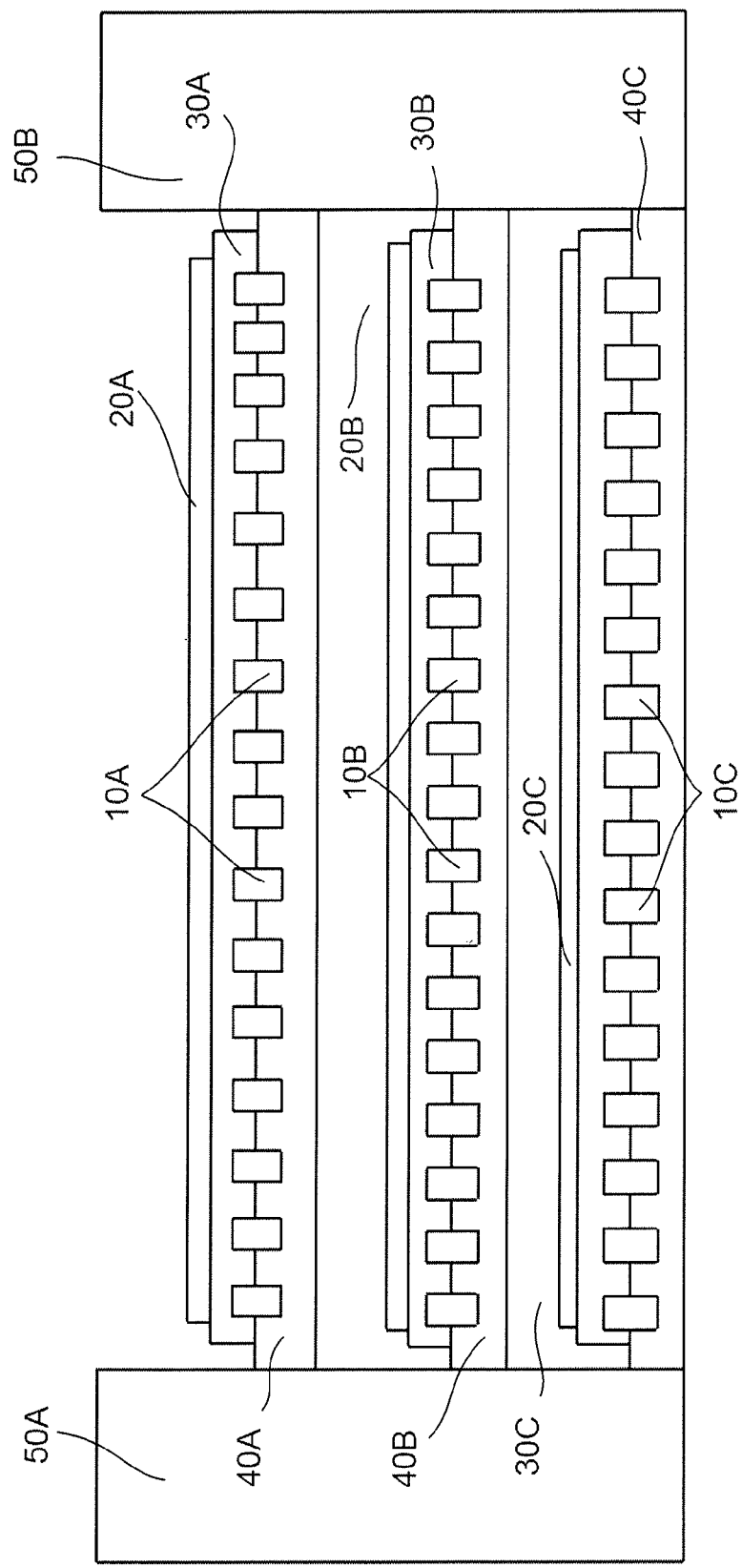
FIG. 9 illustrates a partial graphical end view of the electronic assembly of FIG. 8, and further illustrates an electronic component and chassis operable with the serially arranged cooling plates.

With reference to FIGS. 8 and 9, shown is an exemplary application in which a plurality of exemplary reverse wedgelock devices formed in accordance with the discussion herein may be employed. Specifically, FIGS. 8 and 9 illustrate an electronic assembly having a plurality of electronic components (e.g., see electronic components 20A, 20B and 20C) operable with a plurality of electronic chasses (e.g., see electronic chasses 30A, 30B and 30C). The electronic assembly further comprises a plurality of cold plates (e.g., see cold plates 40A, 40B and 40C) operable to provide a base cooling solution to the plurality of electronic components 20. The plurality of electronic components, chasses and cold plates are situated between frame units 50A and 50B. Furthermore, situated between the several rows of chasses and cold plates are a plurality of reverse wedgelock devices (e.g., see reverse wedgelock devices 10A, 10B and 10C). Although illustrated in FIG. 9, FIG. 8 shows the electronic assembly lacking the electronic chassis 30 and electronic components 20 so as to give a better understanding of the placement and arrangement of the plurality of reverse wedgelock devices 10. As shown, the plurality of reverse wedgelock devices 10 may be located serially across the surface of the cold plates 40.

The electronic chasses 30A-C can be situated within the electronic assembly so as to be opposite the serial arrangement of cold plates 40A-C, wherein these can further be situated so as to be in contact or thermally interface with one another along various areas of contact, and wherein these can be supported between frame units 50A and 50B. The plurality of reverse wedgelock devices 10A-C can be arranged in series between the cold plates 40A-C and the electronic chasses 30 A-C, wherein these can be operated to provide a significant drawing force about the cold plates 40A-C and the chasses 30A-C at multiple points along the contact area. This ability to arrange the reverse wedgelocks serially between the cold plates 40A-C and the electronic chassis 30A-C ensures that the drawing forces can be locally applied to counteract any warping forces, or other forces as described above, which may tend to create a gap between opposing surfaces of the cold plates and the chasses, which can result in a reduction in heat transfer efficiency between them. As can be seen, with the reverse wedgelock devices 10 engaged within the channels formed within the cold plates and the chasses, no space on the surface of the electronic component is utilized to apply the drawing forces, as discussed above. Stated differently, by employing the plurality of reverse wedgelock devices as intended, the entire surface of the electronic component is available to be fully utilized as needed or desired.

The reverse wedgelock devices 10A-C, as shown, can be spaced apart any given distance so as to allow application of needed or desired forces at localized points along the areas of contact between the cold plates and the chasses. Spacing of the reverse wedgelock devices can be even or arbitrary. It is generally noted that the distribution of a plurality of reverse wedgelock devices across the span of a thermally interfaced cold plate and an electronic chassis helps to ensure adequate cooling at any point along the surface of the electronic component. Moreover, it is entirely possible for different reverse wedgelock devices to be caused to apply different amounts of force across a span of a thermally interfaced cold plate and chassis.

As discussed above, prior wedgelocks that expand when torqued would have previously occupied the space above each electronic component, or in order to maximize this space, prior expanding wedgelocks would have been provided only at the edges where high forces are needed to provide sufficient pressure about central regions of the chassis to avoid gaps. Both cases cause significant drawbacks as there is either reduced access to the electronic component, or high bending forces close to the frame edges are required, which could damage the frame or the associate cold plates. As will be appreciated, these drawbacks are avoided with use of the reverse wedgelock devices discussed herein. Specifically, employing one or more reverse wedgelock devices means no potentially damaging forces are required at the edges to provide localized forces at the center of the chassis. Furthermore, no surface area is occupied on the surface of the electronic component. Instead, localized contact forces between each electronic chassis and its respective cooling plate can be provided along the span of the interface between the chasses and the cold plates, which can be achieved by selectively tightening and/or adjusting any one or more of the reverse wedgelock devices interspersed throughout and located between the chasses and the cold plates. As such, different localized areas of contact can comprise different amounts of applied forces.

In addition, while the reverse wedgelock may be formed of any material capable of exerting the required forces, it should also be appreciated that forming the reverse wedgelock of a material having a high thermal conductivity may be beneficial in increasing the thermal efficiency of the electronic assembly as heat may also be caused to be dissipated through the reverse wedgelock device, therefore improving the overall thermal efficiency and performance of the assembly.

Figure 10:
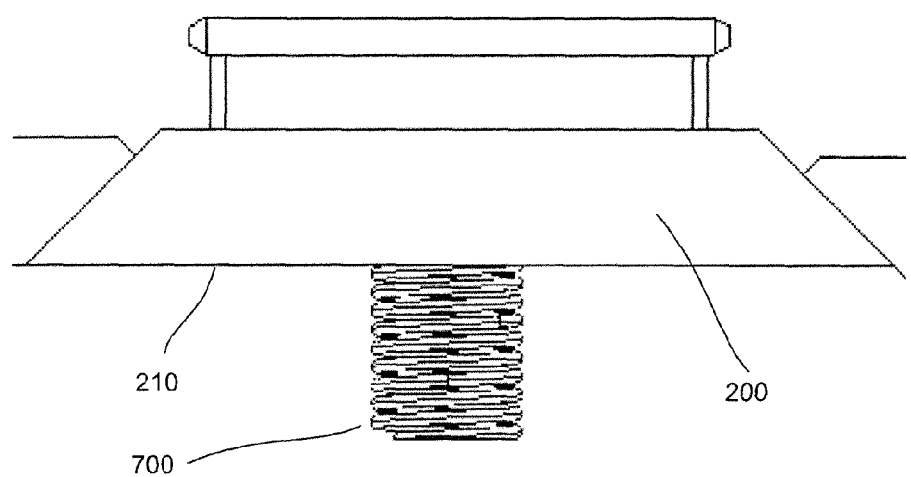
FIG. 10 illustrates a side view of an intermediate draw block of a reverse wedgelock device formed in accordance with another exemplary embodiment, wherein the draw block further comprises a biasing member in the form of a spring.

FIG. 10 illustrates a draw block 200 as part of the reverse wedgelock device 10 of FIG. 1, wherein the draw block 200 (and the corresponding reverse wedgelock) can further comprise a biasing member, such as a spring 700, extending from a leading side 210 of the draw block 200. As discussed above, depending upon the amount of forces exerted to draw two opposing objects together, there is a possibility of some binding to occur between the channels and the anchors of the draw blocks. Provision of a biasing member 700 on the leading side 210 can provide a force that counteracts the draw force, and that helps facilitate release of the anchor from the channel upon loosening of the lead screw. This can be particularly useful when attempting to separate the two opposing objects and disassemble the electronic assembly. It will be appreciated that the biasing member 700 may be provided on any one of the draw blocks 100, 200, 300, 400 and 500. The spring 700 can be sized to fit within the formed channel of the object opposite the one in which the anchor is caused to engage and interface with.

Figure 11:
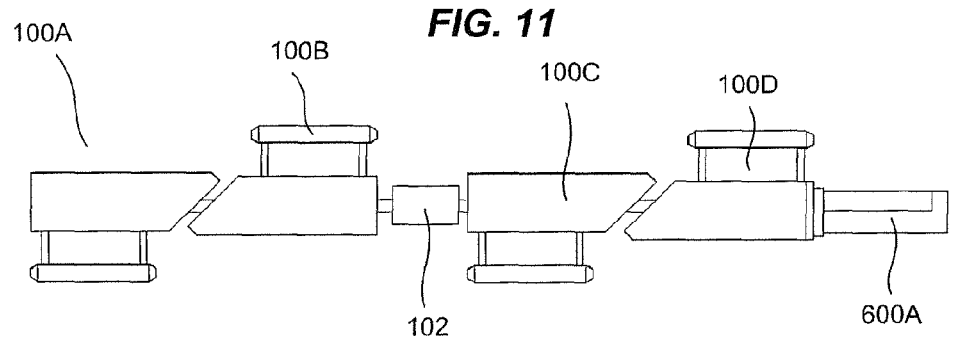
FIG. 11 illustrates a reverse wedgelock device formed in accordance with another exemplary embodiment of the present invention.

FIG. 11 shows a reverse wedgelock 10A in accordance with an exemplary alternative embodiment of the present invention. The reverse wedgelock device 10A is configured similarly to the reverse wedgelock device 10 of FIG. 1 as it comprises a plurality of draw blocks 100A-D having corresponding anchors 150A-D, respectively, configured to fit within corresponding channels (not shown) formed into opposing objects (not shown, but similar to the channels shown and discussed in FIG. 7). However, the reverse wedgelock device 10A of FIG. 11 may further comprise one or more spacer blocks 102 situated between draw blocks, which facilitates in the adjustment of the length of the reverse wedgelock device. Spacer blocks can be removably supported about the lead screw 600A to adjust the overall length of the reverse wedgelock device 10A. Reverse wedgelock device 10A functions similar to the reverse wedgelock of FIG. 1, in that tightening of the lead screw 600A causes one or more draw blocks to slide against an adjacent block, to cause the associated anchors to pull together as discussed herein.

As will be appreciated, many different combinations of draw blocks, end blocks, and spacer blocks can be employed to provide many different reverse wedgelock device configurations.

It is to be understood that the embodiments of the invention disclosed are not limited to the particular structures, process steps, or materials disclosed herein, but are extended to equivalents thereof as would be recognized by those ordinarily skilled in the relevant arts. It should also be understood that terminology employed herein is used for the purpose of describing particular embodiments only and is not intended to be limiting.

Reference throughout this specification to "one embodiment" or "an embodiment" means that a particular feature, structure, or characteristic described in connection with the embodiment is included in at least one embodiment of the present invention. Thus, appearances of the phrases "in one embodiment" or "in an embodiment" in various places throughout this specification are not necessarily all referring to the same embodiment.

As used herein, a plurality of items, structural elements, compositional elements, and/or materials may be presented in a common list for convenience. However, these lists should be construed as though each member of the list is individually identified as a separate and unique member. Thus, no individual member of such list should be construed as a de facto equivalent of any other member of the same list solely based on their presentation in a common group without indications to the contrary. In addition, various embodiments and example of the present invention may be referred to herein along with alternatives for the various components thereof. It is understood that such embodiments, examples, and alternatives are not to be construed as de facto equivalents of one another, but are to be considered as separate and autonomous representations of the present invention.

Furthermore, the described features, structures, or characteristics may be combined in any suitable manner in one or more embodiments. In the following description, numerous specific details are provided, such as examples of lengths, widths, shapes, etc., to provide a thorough understanding of embodiments of the invention. One skilled in the relevant art will recognize, however, that the invention can be practiced without one or more of the specific details, or with other methods, components, materials, etc. In other instances, well-known structures, materials, or operations are not shown or described in detail to avoid obscuring aspects of the invention.

While the foregoing examples are illustrative of the principles of the present invention in one or more particular applications, it will be apparent to those of ordinary skill in the art that numerous modifications in form, usage and details of implementation can be made without the exercise of inventive faculty, and without departing from the principles and concepts of the invention. Accordingly, it is not intended that the invention be limited, except as by the claims set forth below.

What is claimed is:

1. A reverse wedgelock device comprising:
a lead screw configured to apply a compressive force;
a first draw block disposed about the lead screw, and comprising an anchor extending in a first direction from a trailing side, and a wedge surface; and
a second draw block disposed about the lead screw, and comprising an anchor extending from a trailing side in a second direction substantially opposite the first direction, and a wedge surface, the first and second draw blocks forming a draw block chain,
wherein the first and second draw blocks are disposed about the lead screw so as to abut one another about their respective wedge surfaces, and
wherein, upon tightening the lead screw, the first and second draw blocks are compressed and caused to displace relative to one another along their respective wedge surfaces drawing the respective anchors inward toward a longitudinal axis of the lead screw.

2. The device of claim 1, wherein the first and second draw blocks further comprise a lead screw slot, the lead screw being configured to be received within and pass through the lead screw slot.

3. The device of claim 1, wherein the first draw block or the second draw block comprises a biasing member extending from a leading side facing in a direction opposite the trailing side.

4. The device of claim 1, wherein the first draw block comprises an end draw block and the second draw block comprises a stationary draw block configured to be secured in a fixed position, such that tightening of the lead screw causes the end draw block to move relative to the stationary draw block.

5. The device of claim 1, wherein the first draw block comprises a first end draw block and the second draw block comprises a second end draw block, the reverse wedgelock device further comprising an intermediate draw block disposed about the lead screw between the first and second end draw blocks.

6. The device of claim 1, wherein the first draw block comprises a first end draw block and the second draw block comprises a second end draw block, the reverse wedgelock device further comprising at least one intermediate draw block and a stationary draw block disposed about the lead screw between the first and second end draw blocks.

7. The device of claim 1, wherein the anchors of the first and second draw blocks comprise a T-shaped cross-sectional geometry.

8. An assembly comprising:
a first object;
a second object positioned opposite the first object; and
at least one reverse wedgelock device disposed between and engaged with each of the first and second objects, the at least one reverse wedgelock device being configured to apply a force to the first and second objects, the at least one reverse wedgelock device comprising:
- a lead screw configured to apply a compressive force;
- a first draw block disposed about the lead screw, and comprising an anchor extending in a first direction from a trailing side and engaged with the first object, and a wedge surface; and
- a second draw block disposed about the lead screw, and comprising an anchor extending in a second direction from a trailing side and engaged with the second object, and a wedge surface, the first and second draw blocks forming a draw block chain, wherein the first and second draw blocks are disposed about the lead screw so as to abut one another about their respective wedge surfaces, and wherein, upon tightening the lead screw, the first and second draw blocks are compressed and caused to displace relative to one another along their respective wedge surfaces drawing the respective anchors inward toward a longitudinal axis of the lead screw, such that a force is applied to the first and second objects having a tendency to draw the first and second objects together.

9. The assembly of claim 8, wherein the first object comprises an anchoring surface and the second object comprises an anchoring surface facing the anchoring surface of the first object.

10. The assembly of claim 9, wherein the anchoring surface of the first object comprises a channel formed therein configured to receive the anchor of the first draw block, and wherein the anchoring surface of the second object comprises a channel formed therein configured to receive the anchor of the second draw block.

11. The assembly of claim 10, wherein the channels of the first and second objects comprise a cross-sectional configuration corresponding to a cross-sectional configuration of the anchors of the first and second draw blocks, respectively.

12. The assembly of claim 9, wherein the assembly comprises an electronic assembly, and wherein one of the first or second objects comprises a cooling plate of a heat sink, and the other of the first or second objects comprises a chassis of an electronic component operable with the cooling plate.

13. The assembly of claim 8, wherein the first draw block comprises a stationary draw block fixed to the first object via an anchor extending from a surface of the stationary draw block.

14. The assembly of claim 8, wherein the first and second draw blocks are slidably engaged with the first and second objects, respectively, such that the first and second draw blocks comprise floating draw blocks configured to move and float about the first and second objects and the lead screw upon tightening of the lead screw.

15. The assembly of claim 10, further comprising a plurality of reverse wedgelock devices operable with the first and second objects to provide localized application of drawing forces between the first and second objects.

16. The assembly of claim 8, wherein the first draw block or the second draw block comprises a biasing member extending from a leading side facing in a direction opposite the trailing side, the biasing member being configured to provide a counteracting force acting against the first or the second object.

17. A method of drawing two objects together comprising:
- obtaining a first object;
- positioning a second object about the first object;
- disposing one or more reverse wedgelock devices between the first and second objects, the reverse wedgelock devices comprising:
  - a lead screw configured to apply a compressive force;
  - a first draw block disposed about the lead screw, and comprising an anchor extending in a first direction from a trailing side and engaged with the first object, and a wedge surface; and
  - a second draw block disposed about the lead screw, and comprising an anchor extending in a second direction from a trailing side and engaged with the second object, and a wedge surface, the first and second draw blocks forming a draw block chain;
- causing the one or more reverse wedgelock devices to engage the first and second objects; and
- manipulating the lead screw and causing the first and second draw blocks to compress and displace relative to one another along their respective wedge surfaces, wherein the respective anchors are drawn inward toward a longitudinal axis of the lead screw, such that a force is applied to the first and second objects, which force has a tendency to draw the first and second objects together.

18. The method of claim 17, further comprising inserting the anchors of the first and second draw blocks into respective channels formed in respective anchoring surfaces of the first and second objects.

19. The method of claim 17, further comprising disposing a plurality of reverse wedgelock devices between the first and second objects.

20. The method of claim 19, further comprising selectively adjusting the plurality of reverse wedgelock devices to obtain selective localized application of forces between the first and second objects.

* * * * *